(12) United States Patent
Ojha et al.

(10) Patent No.: US 12,113,521 B2
(45) Date of Patent: Oct. 8, 2024

(54) SYSTEMS AND METHODS FOR REGULATION OF PROPAGATION DELAY IN DC MOTOR DRIVERS

(71) Applicant: Texas Instruments Incorporated, Dallas, TX (US)

(72) Inventors: Ashish Ojha, Bangalore (IN); Krishnamurthy Shankar, Bangalore (IN); Siddhartha Gopal Krishna, Bengaluru (IN); Priyank Anand, Bangalore (IN); Ganapathi Hegde, Bengaluru (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 97 days.

(21) Appl. No.: 17/397,133

(22) Filed: Aug. 9, 2021

(65) Prior Publication Data

US 2023/0039198 A1    Feb. 9, 2023

(51) Int. Cl.
*H03K 17/687*    (2006.01)
*H02P 23/00*    (2016.01)
*H03K 5/24*    (2006.01)

(52) U.S. Cl.
CPC ........... *H03K 17/687* (2013.01); *H02P 23/00* (2013.01); *H03K 5/24* (2013.01)

(58) Field of Classification Search
CPC ...... H03K 17/687; H03K 5/24; H03K 17/284; H03K 2217/0045; H03K 17/28; H02P 23/00

See application file for complete search history.

(56) References Cited

U.S. PATENT DOCUMENTS

| | | | |
|---|---|---|---|
| 11,152,857 B2 | 10/2021 | Han | |
| 11,552,633 B1 | 1/2023 | Cignoli | |
| 2004/0140833 A1 | 7/2004 | Kim | |
| 2007/0040536 A1 | 2/2007 | Smith, Jr. et al. | |
| 2008/0232144 A1 | 9/2008 | Klein | |
| 2012/0027447 A1 | 2/2012 | Mukaibara | |
| 2012/0229113 A1 | 9/2012 | Houston et al. | |
| 2017/0201086 A1 | 7/2017 | Chen et al. | |
| 2020/0153429 A1 | 5/2020 | Butenhoff et al. | |
| 2020/0228012 A1* | 7/2020 | Lynch ................. | H02M 3/158 |
| 2022/0231592 A1 | 7/2022 | Lin et al. | |
| 2022/0350354 A1 | 11/2022 | D'Souza et al. | |

* cited by examiner

*Primary Examiner* — Jung Kim
(74) *Attorney, Agent, or Firm* — John R. Pessetto; Frank D. Cimino

(57) ABSTRACT

A control circuit regulates the propagation delay of a field effect transistor (FET) before the FET transitions to the Miller region by applying a pre-charge current for a fixed duration to the gates of the FET. After the fixed duration, the current is reduced to a lower drive current level which is based on a desired output voltage slew rate. After the FET transitions to the Miller region, the output voltage slews down in accordance with the output voltage slew rate. By regulating the slew-rate of the output voltage in the Miller region and regulating the propagation delay of the FET prior to the Miller region, the control circuit reduces electromagnetic interference (EMI) caused by the switching of the FET, thereby improving electromagnetic compatibility (EMC) of switch mode driver systems without increasing the propagation delay of the FET.

17 Claims, 5 Drawing Sheets ns and methods for
regulation of propagation delay in
DC motor drivers

TECHNICAL FIELD

This description relates generally to DC motor drivers.

BACKGROUND

DC motors are found in automobiles, industrial fans and pumps, machine tools, household appliances, drones, gimbles, and disk drives. A DC motor is generally run by a driver circuit which may include a number of field effect transistors (FETs) arranged in a bridge configuration. The driver circuit controls motor speed and torque by providing a pulsed direct current of varying pulse length and frequency to the motor. In some applications, the DC motor may be located at a distance (e.g., >5 m) from the driver circuit, thus requiring long cables to electrically connect the DC motor to the driver circuit. As the FETs are switched at a high frequency to provide the pulsed current to the motor, the output voltage slews at a high rate. Because of the long cables and the slew rate of the output voltage, electromagnetic interference (EMI) can occur. To reduce EMI, the slew rate can be lowered by decreasing gate current applied to the FETs. However, if the gate current is decreased, the propagation delay of the FETs is increased.

SUMMARY

In one aspect, an apparatus for regulating a propagation delay period of a transistor incorporated into circuitry which provides an output voltage includes a comparison circuit which has a first input adapted to be coupled to the output voltage, a second input adapted to be coupled to an upper reference voltage, and a third input adapted to be coupled to a lower reference voltage. The comparison circuit provides a start signal if the output voltage falls below the upper reference voltage and provides an end signal if the output voltage falls below the lower reference voltage. The apparatus includes a propagation delay detection circuit which has a first input coupled to a pulse width modulated (PWM) signal and a second input coupled to the first comparison circuit. The propagation delay detection circuit provides a propagation delay. The apparatus includes a current level control circuit which has a first input coupled to receive a target propagation delay and a second input coupled to the propagation delay detection circuit. The current level control circuit provides an adjust signal in response to a comparison of the propagation delay and the target propagation delay. The apparatus includes a gate current selection circuit which has a first input coupled to receive the adjust signal, a second input coupled to receive an output voltage slew rate, a third input coupled to receive a post-charge current level, and a fourth input coupled to receive a timing signal. The gate current selection circuit provides at least one gate current level value responsive to at least one of the first input, second input, third input and fourth input. The apparatus includes a gate driver which has a first input coupled to receive the PWM signal a second input coupled to the gate current selection circuit. The gate driver is coupled to a control terminal of the transistor.

In an additional aspect, the adjust signal is an increment (UP) signal if the propagation delay is greater than the target propagation delay and a decrement (DN) signal if the propagation delay is less than the target propagation delay.

In an additional aspect, the apparatus includes a timing control circuit which has a first input coupled to receive the PWM signal and a second input coupled to receive the start/end signal. The timing control circuit provides the timing signal indicating: the FET has not transitioned to the Miller region; the FET has transitioned to the Miller region; or the FET has exited the Miller region.

In an additional aspect, responsive to the UP signal and the timing signal indicating the FET has not transitioned to the Miller region, the gate current selection circuit increases the gate current level value, and responsive to the DN signal and the timing signal indicating the FET has not transitioned to the Miller region, the gate current selection circuit decreases the gate current level value.

In an additional aspect, responsive to the increase of the gate current level value, the gate driver increases a pre-charge current level of a gate signal for a fixed duration, and responsive to the decrease of the gate current level value, the gate driver reduces a pre-charge current level of a gate signal for a fixed duration.

In an additional aspect, responsive to the timing signal indicating the FET has transitioned to the Miller region, the gate current selection circuit reduces the gate current level value corresponding to a predetermined output voltage slew rate.

In an additional aspect, the comparison circuit includes a first comparator which has a non-inverting input adapted to be coupled to receive the upper reference voltage and an inverting input adapted to be coupled to receive the output voltage. The first comparator provides the start signal if the output voltage falls below the upper reference voltage. The comparison circuit includes a second comparator which has a non-inverting input adapted to be coupled to receive the lower reference voltage and an inverting input adapted to be coupled to receive the output voltage. The second comparator provides the end signal if the output voltage falls below the lower reference voltage.

In an additional aspect, a motor driver circuit includes a FET which has a first terminal coupled to an output voltage terminal, a second terminal coupled to a ground terminal, and a control terminal. The motor driver circuit includes a gate driver which has a first input coupled to receive a PWM signal and a second input coupled to receive a gate current level value. The gate driver provides a gate signal to the control terminal of the FET. The motor driver circuit includes a gate current selection circuit which has a first input coupled to receive an adjust signal, a second input coupled to receive an output voltage slew rate, a third input coupled to receive a timing signal, and a fourth input coupled to receive a post-charge current level. The gate current selection circuit provides the gate current level value responsive to at least one of the first input, second input, third input and fourth input. The motor driver circuit includes a current level control circuit which has a first input coupled to receive a target propagation delay and a second input coupled to receive a propagation delay. The current level control circuit provides the adjust signal in response to a comparison of the propagation delay and the target propagation delay. The motor driver circuit includes a propagation delay detection circuit which has a first input coupled to receive the PWM signal and a second input coupled to receive a start/end signal. The propagation delay detection circuit provides the propagation delay. The motor driver circuit includes a comparison circuit which has a first input adapted to be coupled to an output voltage, a second input adapted to be coupled to an upper reference voltage, and a third input adapted to be coupled to a lower reference voltage. The comparison circuit provides the start signal if the output voltage falls below the upper reference voltage and provides the end signal if the output voltage falls below the lower reference voltage.

In an additional aspect, a method of regulating propagation delay of a FET includes selecting a target propagation delay period, a pre-charge period, and an output voltage slew rate. The pre-charge period is less than the target propagation delay period. The method includes determining a drive current required for the output voltage slew-rate. The method includes applying a gate signal to the FET. The gate signal has a pre-charge current during the pre-charge period and has the drive current after the pre-charge period. The pre-charge current is higher than the drive current. The method includes comparing the output voltage to an upper reference voltage and a lower reference voltage, and determining a propagation delay period of the FET. If the propagation delay period is greater than the target propagation delay period, the pre-charge current of the next gate signal is increased to reduce the propagation delay period, and if the propagation delay period is less than the target propagation delay period, the pre-charge current of the next gate signal is decreased to increase the propagation delay period. The steps of increasing/decreasing the pre-charge current are repeated until the propagation delay period is approximately equal to the target propagation delay.

BRIEF DESCRIPTION OF THE DRAWINGS

The same reference numerals or other reference designations are used in the figures to designate the same or similar (functionally and/or structurally) features.

DETAILED DESCRIPTION

In some example embodiments, a control circuit regulates the propagation delay of a field effect transistor (FET) before the FET transitions to the Miller region in which the gate to source voltage (Vgs) of the FET is relatively flat (sometimes referred to as the Miller Plateau) by applying a pre-charge current I-Pre_Ch for a fixed duration T-PCH to the gate of the FET. After the fixed duration T-PCH, the current applied to the gate is reduced to a lower level I_Drive which is based on a desired output voltage slew rate. In the Miller region, the output voltage slews down in accordance with I_Drive. By regulating the propagation delay of the FET prior to operation in the Miller region and controlling the slew rate by the gate current I_Drive, electromagnetic interference (EMI) caused by the switching of the FET is reduced. In an example embodiment, the slew rate is reduced by reducing I_Drive thereby improving electromagnetic compatibility (EMC) of switch mode driver systems without increasing the propagation delay of the FET.

In an example embodiment, the FET is an n-channel field effect transistor (NFET), and in another example embodiment, the FET is a p-channel field effect transistor (PFET).

Figure 1:
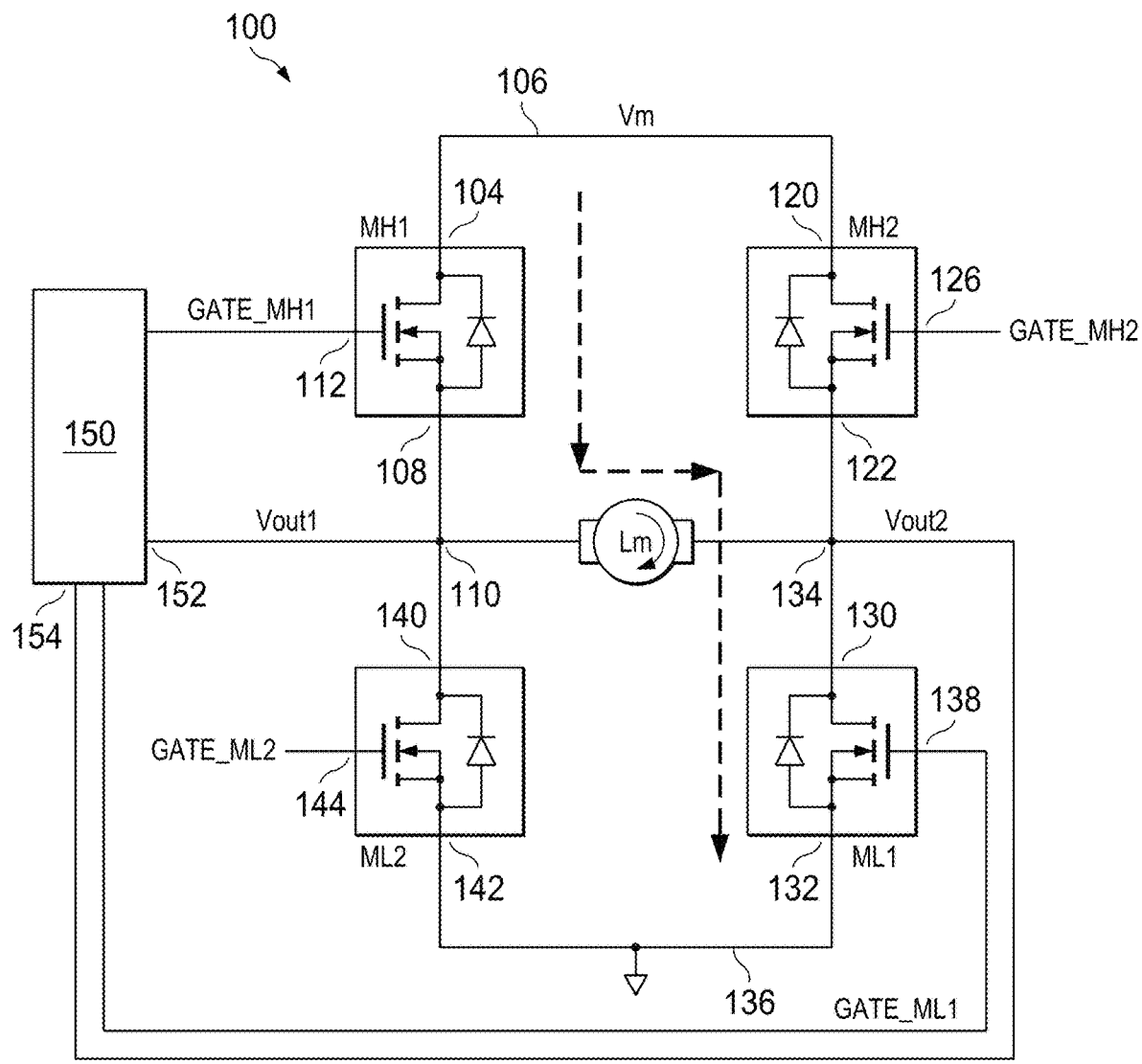
FIG. 1 is a block diagram of a driver system of an example embodiment.

FIG. 1 is a block diagram of a driver system 100 of an example embodiment. The system 100 includes a first high-side FET MH1 which has a first terminal 104 (e.g., drain) coupled to an input voltage terminal 106 which may be coupled to an input voltage Vm (e.g., 12V, 25V, or 40V). The first high-side FET MH1 has a second terminal 108 (e.g., source) coupled to a first switching terminal 110 (also referred to as a first output). The high-side FET MH1 has a gate 112. In addition, the FET MH1 includes a body diode with the anode coupled to the switching terminal 110 and the cathode coupled to the input voltage terminal 106.

The system 100 includes a second high-side FET MH2 which has a first terminal 120 coupled to the input voltage terminal 106. The second high-side FET MH2 has a second terminal 122 coupled to a second switching terminal 134 (also referred to as a second output). The second high-side FET MH2 has a gate 126. In addition, the FET MH2 includes a body diode with the anode coupled to the switching terminal 134 and the cathode coupled to the input voltage terminal 106.

The system 100 includes a first low-side FET ML1 which has a first terminal 130 coupled to the second switching terminal 134 and has a second terminal 132 coupled to a common potential (e.g., ground) terminal 136. The first low-side FET ML1 has a gate 138. In addition, the FET ML1 includes a body diode with the anode coupled to the ground terminal 136 and the cathode coupled to the switching terminal 110.

The system 100 includes a second low-side FET ML2 which has a first terminal 140 coupled to the first switching terminal 110 and a second terminal 142 coupled to the ground terminal 136. The second low-side FET ML2 has a gate 144. In addition, the FET ML2 includes a body diode with the anode coupled to the ground terminal 136 and the cathode coupled to the switching terminal 134.

Although, in the example embodiment of FIG. 1, the FETs are shown as enhancement-type FETs, the system 100 can be configured with other types of FETs.

The system 100 provides output voltages Vout1 and Vout2 at the respective first switching terminal 110 and the second switching terminal 134. An inductive load Lm (e.g., DC motor) is connected between the switching terminals 110 and 134.

The system 100 includes a control circuit 150 which has a first input 152 coupled to receive the first output voltage Vout1 and a second input 154 coupled to receive the second output voltage Vout2. Additionally, control circuit 150 is coupled to gates 112, 126, 138 and 144 of the FETs MH1, MH2, ML1 and ML2, respectively.

In an example embodiment, to drive the DC motor in one direction, the control circuit 150 provides a first high-side gate signal Gate_MH1 to the gate 112 of MH1 and provides a first low-side gate signal Gate_ML1 to the gate 138 of ML1. The first low-side gate signal Gate_ML1 is a pulse width modulated (PWM) signal which rapidly switches ML1 (i.e., turns on/off) while the first high-side gate signal Gate_MH1 maintains MH1 in an "on" state. As a result, current flows from the input voltage supply Vm through the high-side FET MH1, and through the motor Lm, and then through the low-side FET ML1 to ground. To drive the DC motor in the reverse direction, the control circuit 150 provides a second high-side gate signal Gate_MH2 to the gate 126 of MH2 and provides a second low-side gate signal Gate_ML2 to the gate 144 of ML2. The second low-side gate signal Gate_ML2 is a pulse width modulated (PWM) signal which rapidly switches ML2 (i.e., turns on/off) while the second high-side gate signal Gate_MH2 maintains MH2 in an "on" state. In other example embodiments, PWM signals can be applied to the high-side FET while the low-side FET can be maintained in an "on" state.

In some example embodiments (such as the one shown in FIG. 1), transistors MH1, MH2, ML1 and ML2 are depicted as n-channel metal-oxide-silicon FETs (nMOSFETs), so the gate signals to turn on these transistors will need to be a sufficiently high value to turn "on" these nMOSFETs. In other example embodiments, these transistors are implemented using p-channel MOSFETs (pMOSFETs), so the gate signals will need to be at a sufficient value to turn "on" these pMOSFETs.

In an example embodiment, the control circuit 150 compares the output voltage Vout2 to an upper reference voltage Vref_H and a lower reference voltage Vref_L to determine whether: (1) the FET ML1 has not yet transitioned to the Miller region; (2) the FET has transitioned to the Miller region; or (3) the FET has exited the Miller region. This determination by the control circuit 150 is discussed below in further detail. If the FET ML1 has not yet transitioned to the Miller region, the control circuit 150 adaptively regulates the propagation delay of the FET ML1 by varying (i.e., increasing or decreasing) a pre-charge current applied to the gate 138 of ML1 for a fixed duration. If ML1 has transitioned to the Miller region, the gate current is reduced to a lower level I_Drive which is determined based on the desired output voltage slew rate. The output voltage Vout1 slews at the desired slew rate in the Miller region. By measuring Vout2 and modulating the pre charge current, the control circuit 150 adaptively regulates the propagation delay of the FET ML1.

In another example embodiment, the control circuit 150 compares Vout1 to an upper reference voltage Vref_H and a lower reference voltage Vref_L to determine whether: (1) the FET ML2 has not yet transitioned to the Miller region; (2) the FET ML2 has transitioned to the Miller region; or (3) the FET ML2 has exited the Miller region. If ML2 has not transitioned to the Miller region, the control circuit 150 adaptively regulates the propagation delay of ML2 by varying a pre-charge current applied to the gate 144 for a fixed duration and thereafter reduces the gate current to a lower level I_Drive to provide a desired output voltage slew rate. Thus, by measuring Vout1 and modulating the pre charge current, the control circuit 150 regulates the propagation delay of ML2. In an example embodiment, I_Drive can have a magnitude between 100 uA and 20 mA, and the precharge current I-Pre_Ch can vary between 100 uA and 100 mA.

Figure 2:
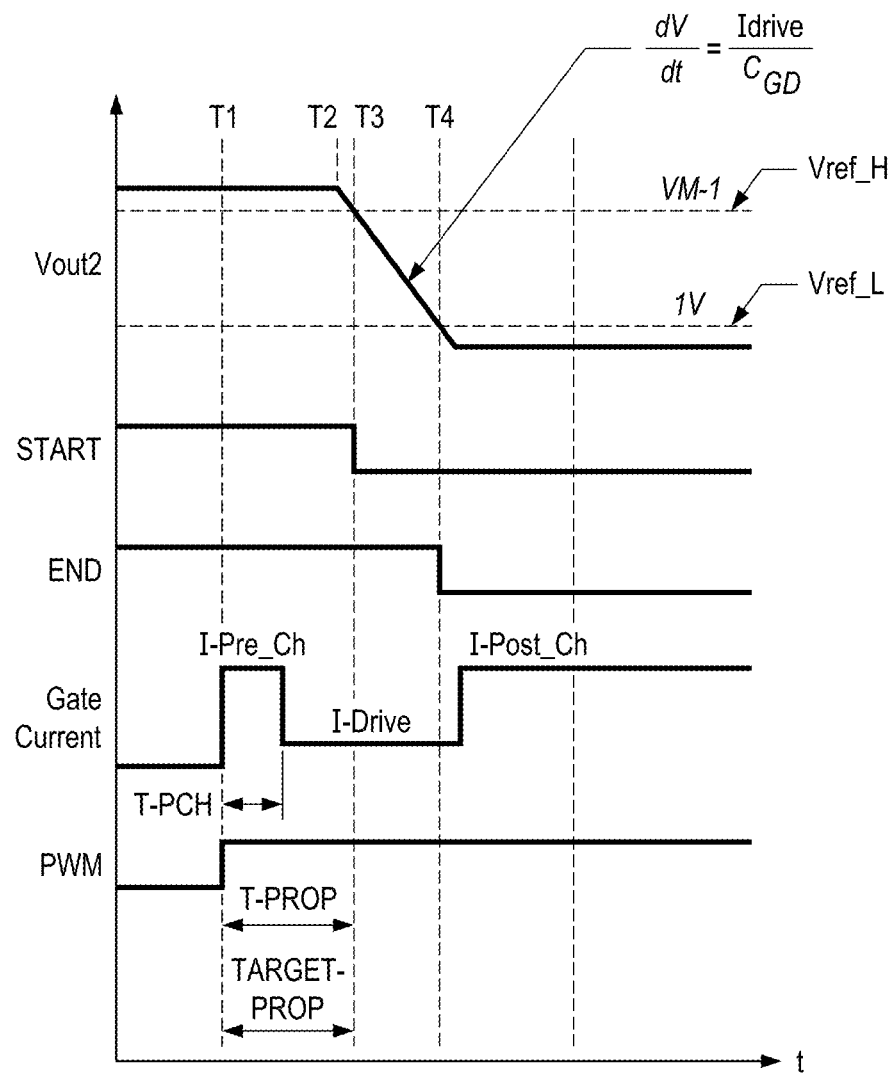
FIGS. 2-3 are waveforms illustrating propagation delay regulation using some example embodiments.

FIG. 2 are waveforms illustrating how the control circuit 150 identifies different conduction regions of a FET (e.g., low-side FET ML1) during operation, and based on the identification of the regions the control circuit 150 regulates the propagation delay of the FET. In the example of FIG. 2, the control circuit 150 measures Vout2 to identify whether: (1) the low-side FET ML1 has not yet transitioned to the Miller region; (2) the low-side FET ML1 has transitioned to the Miller region; or (3) the low-side FET ML1 has exited the Miller region. In FIG. 2, the x-axis represents time, and the y axis represents current with respect to I_Drive and I-Pre_Ch and represents voltage with respect to Vgs, Vout2, and PWM signal.

In an example embodiment, initially, the following parameters are chosen: (1) a target propagation delay Target-Prop; (2) a pre-charge period T-Pre_Ch; and (3) an output voltage slew-rate. The target propagation delay Target-Prop can be chosen based on, for example, system requirements. The pre-charge period T-PCH is defined as a duration in which a pre-charge current I-Pre_Ch is applied to the gate of the FET. The pre-charge period T-PCH is less than the target propagation delay TARGET-PROP. In an example embodiment, the aforementioned parameters can be user defined based on system requirements. Based on the chosen output voltage slew-rate, the required gate current I_Drive is calculated.

At time T1, a PWM signal is received, and in response the control circuit 150 applies a gate signal Gate_ML1 to the gate 138 of the low-side FET ML1. During the precharge period T-Pre_Ch, the magnitude (with respect to current) of gate signal Gate_ML1 is the pre-charge current I-Pre_Ch (which is greater than I_Drive). (In FIG. 2 the gate signal is not shown but the magnitude of its current is shown with respect to the graph "Gate Current".) As discussed below, the control circuit 150 may increase or decrease I-Pre_Ch during the fixed duration T-PCH based on the following conditions:

(1) T-PCH>TARGET-PROP; and
(2) T-PCH<TARGET-PROP.

By increasing the pre-charge current I-Pre_Ch, the control circuit 150 reduces the time required by the FET ML1 to transition to the Miller region, thus reducing the actual propagation delay T-PROP. Conversely, by decreasing the pre-charge current I-Pre_Ch, the control circuit 150 increases the time required by the FET ML1 to transition to the Miller region, thus increasing the actual propagation delay T-PROP.

At time T1, because the FET ML1 has not conducted yet, the output voltage Vout2 is approximately Vm because Vm appears at the node 134 through the body diode of MH2. The pre-charge current I-Pre_Ch is maintained for a fixed duration T-PCH and is thereafter reduced to I_Drive. At time T2, the FET ML1 begins a transition to the Miller region and begins to conduct, and as a result, Vout2 begins to slew down. The control circuit 150 compares Vout2 with an upper reference voltage Vref_H. The upper reference voltage Vref_H is set at a level near Vm (e.g., Vref_H=Vm-1 volt). At time T3, Vout2 falls below Vref_H, and, in response, the control circuit 150 provides a start signal START and determines: (i) that the FET ML1 has transitioned to the Miller region and (ii) the actual propogation time T-PROP (where, in some examples, T-PROP=T3-T1).

If T-PROP>TARGET-PROP, in the next cycle (not shown in FIG. 2) the control circuit 150 increases the pre-charge current I-Pre_Ch to reduce T-PROP. Conversely, if T-PROP<TARGET-PROP, in the next cycle the controller 150 reduces I-Pre-Ch to increase T-PROP. The steps of increasing or decreasing I-Pre_Ch are repeated over a plurality of FET on/off cycles until T-PROP is approximately equal to TARGET-PROP at which stage the control circuit 150 acquires a loop lock to regulate T-PROP by varying I-Pre_Ch.

In the Miller region, the slew rate (i.e. the change in voltage of time or dV/dt) of Vout2 can be represented by the following equation:

$$dV/dt = I\_Drive/C_{GD} \qquad (1)$$

where $C_{GD}$ is an equivalent capacitance between the gate and the drain of the FET. By choosing a slew rate dV/dt that satisfies EMI/EMC requirements, the corresponding I_Drive can be calculated.

At time T4, when Vout2 falls below a lower reference voltage Vref_L, the control circuit 150 provides an end signal END and determines that the FET ML1 has exited the Miller region and has transitioned to the FET enhancement region. In response, the control circuit 150 increases the gate current to a post charge level I-Post_Ch to reduce an equivalent resistance (i.e., Rds) between the drain and the source of the FET in the enhancement region, thus reducing enhancement region losses (i.e., dissipation loss). The lower reference voltage Vref_L may be set at near zero voltage (e.g., Vref_L=1V).

Figure 3:
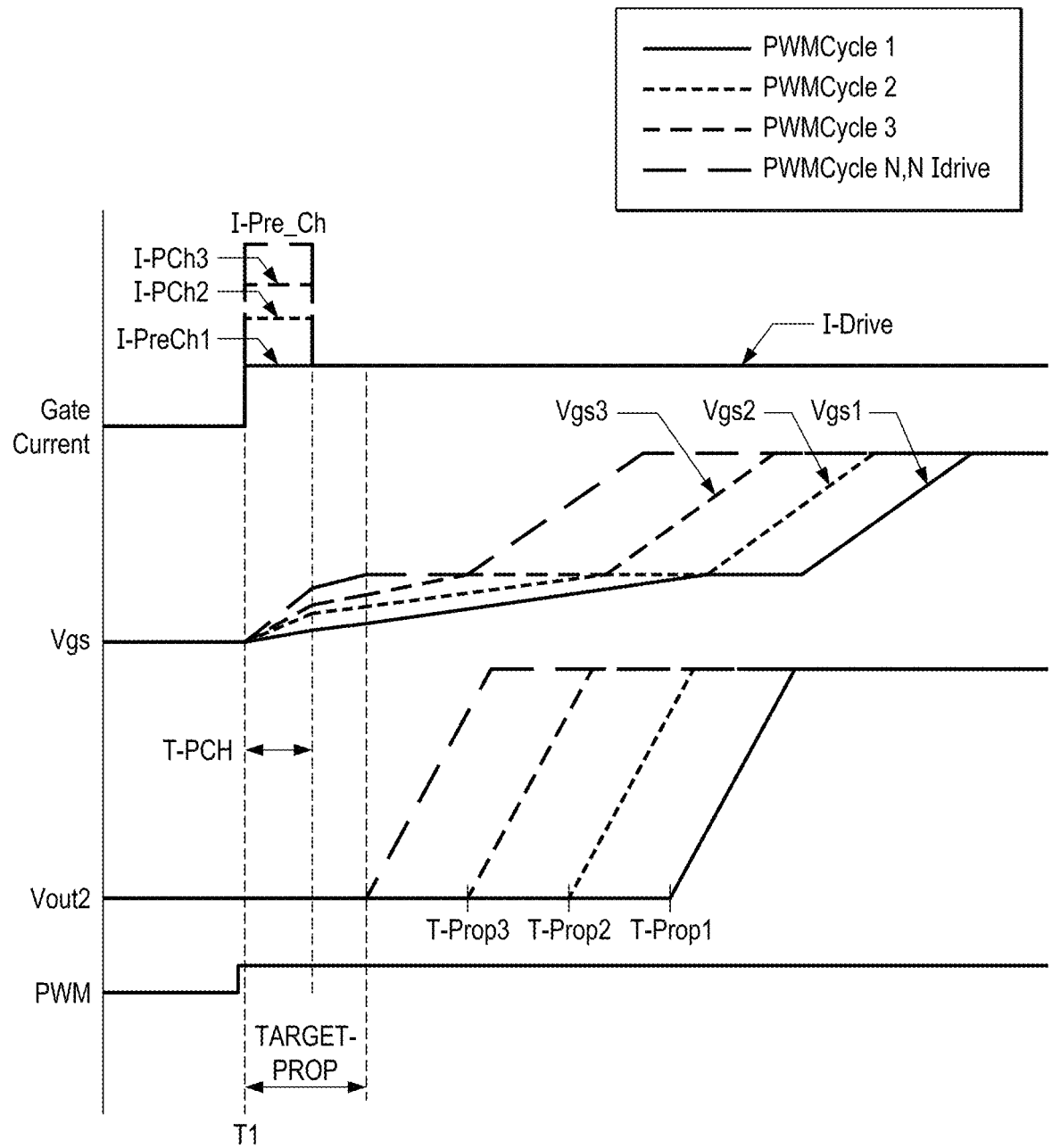

FIG. 3 are waveforms illustrating how the control circuit 150 adaptively regulates the propagation delay T-Prop by varying the pre-charge current I-Pre_Ch applied to a FET during T-PCH. In the example of FIG. 3, the control circuit 150 regulates the propagation delay T-Prop by varying the pre-charge current applied to the low-side FET ML1. However, the propagation delay can be regulated in a similar manner by varying the pre-charge current applied to one of the other FETs (e.g., high-side FET).

With reference to FIG. 3, at time T1, a PWM signal (shown in solid line) appears which causes the control circuit 150 to apply a gate signal Gate_ML1 which has a pre-charge current I-Pre_Ch1 (shown in solid line). In FIG. 3, the gate signal is not shown but the magnitude of its current (Igate) is shown. As a result, a voltage Vgs1 (shown in solid line) appears between the gate and the source of ML1. The control circuit 150 measures Vout2 (shown in solid line) and determines the actual propagation time T-Prop1. Because T-Prop1>Target-Prop, in the next cycle (shown as the shortest dashed lines in the graphs of FIG. 3) the control circuit 150 increases the pre-charge current to I-Pre_Ch2, which results in the actual propagation time T-Prop2 and Vgs2. Because T-Prop2>TARGET-PROP, the control circuit 150 again increases the pre-charge current to I-Pre_Ch3, which results in the actual propagation time T-Prop3 and Vgs3. Because, T-Prop3>TARGET-PROP, the control circuit 150 again increases the pre-charge current to I-Pre_Ch4, which results in T-Prop4 and Vgs4. Because, T-Prop4 is approximately equal to TARGET-PROP, the control circuit 150 acquires a loop lock and is able to regulate the propagation delay. In the example of FIG. 3, it requires four cycles to achieve the target propagation delay.

Figure 4:
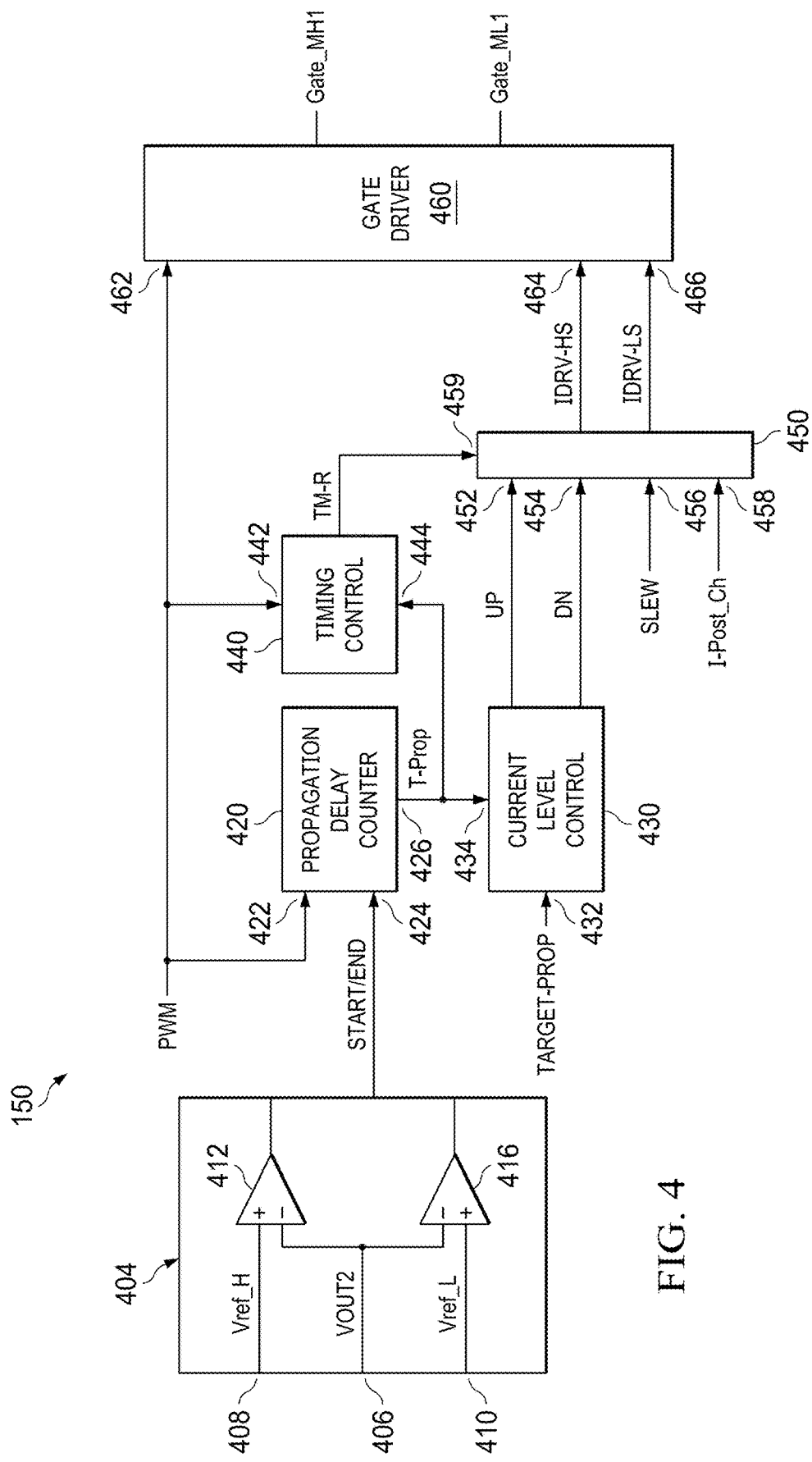
FIG. 4 is a block diagram of the control circuit of an example embodiment.

FIG. 4 illustrates a block diagram of the control circuit 150 of an example embodiment (Comment: the control circuit of FIG. 4 is equivalent to the control circuit of FIG. 1). In this example, the control circuit 150 is described only with reference to MH1 and ML1. The control circuit 150 may also control MH2 and ML2 in a similar manner as it controls MH1 and ML1 or a second control circuit 150 can be included in the circuitry of FIG. 1 for the control of MH2 and ML2. The control circuit 150 is configured to measure Vout2, and in response, provide gate signals to drive ML1 and MH1. To drive the DC motor in one direction, the control circuit 150 provides a first low-side gate signal Gate_ML1 to ML1 (shown in FIG. 1) and a first high-side gate signal Gate_MH1 to MH1 (shown in FIG. 1). As discussed before, the low-side gate signal Gate_ML1 is a PWM signal which causes ML1 to rapidly switch (i.e., turn on/off) while the high-side gate signal Gate_MH1 maintains MH1 in an "on" state.

The control circuit 150 includes a comparison circuit 404 which has a first input 406 coupled to receive the output voltage Vout2, a second input 408 coupled to receive the upper reference voltage Vref_H and a third input 410 coupled to receive the lower reference voltage Vref_L. The comparison circuit 404 compares Vout2 to Vref_H and Vref_L, and, based on the comparison, determines whether: (1) the FET ML1 has not yet transitioned to the Miller region; (2) the FET ML1 has transitioned to the Miller region; or (3) the FET ML1 has exited the Miller region and has transitioned to the FET enhancement region. The control circuit 150 provides a start signal START if ML1 has transitioned to the Miller region and provides an end signal END if ML1 has left the Miller region.

In an example embodiment, the comparison circuit 404 is implemented with first and second comparators 412 and 416. The first comparator 412 has a non-inverting input coupled to receive Vref_H and an inverting input coupled to receive Vout1. The first comparator 412 provides the start signal START if Vout2<Vref_H. The second comparator 416 has a non-inverting input coupled to receive the upper reference voltage Vref_L and an inverting input coupled to receive Vout2. The second comparator 416 provides the end signal END if Vout2<Vref_L.

The control circuit 150 includes a propagation delay detection circuit 420 which has a first input 422 coupled to receive a pulse width modulated (PWM) signal and a second input 424 coupled to receive the START/END signal. The propagration delay detection circuit 420 provides the propagation delay T-Prop at an output 426. In an example embodiment, the propagation delay detection circuit 420 is implemented with a phase detector/counter which measures the delay between a rising edge of the PWM signal and a rising edge of the START/END signal and in response provides the propagation delay T-Prop. The PWM signal may be generated by, for example, a comparator (not shown in FIG. 4) which compares a reference voltage to a triangle wave or may be generated by a microprocessor, ASIC, or software.

The control circuit 150 includes a current level control circuit 430 which has a first input 432 coupled to receive a target propagation delay TARGET-PROP and a second input 434 coupled to receive the propagation delay T-Prop. The target propagation delay TARGET-PROP may be chosen based on system requirements. The current level control circuit 430 provides the increment (UP) signal if T-Prop>TARGET-PROP and provides the decrement (DN) signal if T-Prop<TARGET-PROP. If T-Prop>TARGET-PROP, the current level control circuit 430 provides the increment (UP) signal to indicate that the pre-charge current applied to the gate of ML1, for example, needs to be increased to reduce the propagation delay T-Prop. Conversely, if T-Prop<TARGET-PROP, the current level control circuit 430 provides the decrement (DN) signal to indicate that the pre-charge current needs to be reduced to increase T-Prop.

The control circuit 150 includes a timing control circuit 440 which has a first input 442 coupled to receive the PWM signal and a second input 444 coupled to receive the propagation delay T-Prop. The timing control circuit 440 provides a timing signal TM-R which indicates: ML1 has not yet transitioned to the Miller region; ML1 has transitioned to the Miller region; or ML1 has exited the Miller region.

The control circuit 150 includes a gate current selection circuit 450 which has a first input 452 coupled to receive the increment (UP) signal, a second input 454 coupled to receive the decrement (DN) signal, a third input 456 coupled to receive the output voltage slew rate, a fourth input 458 coupled to receive a post-charge current level, and a fifth input 459 coupled to receive the timing signal TM-R. Responsive to TM-R, the gate current selection circuit 450 selects one of the UP signal, the DN signal, the output voltage slew rate, and the post-charge current level, and provides a high-side gate current level signal IDRV-HS and a low-side current level signal IDRV-LS.

In an example embodiment, the gate current selection circuit 450 is a selection logic circuit. Depending on the timing signal TM-R, the gate current selection circuit 450 selects any one of UP, DN, I-Post_Ch, SLEW and in response generates IDRV-LS and IDRV_HS. The gate current selection circuit 450 may be implemented with a processor or with multiplexers.

In an example embodiment, IDRV-HS and IDRV-LS have digital formats (e.g., 11-bit data) which translate to the current levels of the gate signals applied to the FETs.

If the gate current selection circuit 450 receives the increment (UP) signal and the timing signal TM-R indicates ML1 has not yet transitioned to the Miller region, the pre-charge current level needs to be increased to reduce the propagation delay T-Prop. Conversely, if the gate current selection circuit 450 receives the decrement (DN) signal and the timing signal TM-R indicates ML1 has not transitioned to the Miller region, the pre-charge current level needs to be decreased to increase the propagation delay T-Prop. Thus, responsive to the UP signal and the timing signal TM-R indicating ML1 has not transitioned to the Miller region, the gate current selection circuit 450 provides outputs indicating the need to increase the high-side and low-side charge current levels, and responsive to the DN signal and the timing signal TM-R indicating ML1 has not transitioned to the Miller region, the gate current selection circuit 450 provides outputs indicating the need to decrease the high-side and low-side charge current levels.

If the timing signal TM-R indicates ML1 has transitioned to the Miller region, the gate current selection circuit 450 selects the output voltage slew rate and provides IDRV-HS and IDRV-LS which translate to the gate current level I-Drive required to maintain the desired slew rate in the Miller region.

If the timing signal TM-R indicates that ML1 has exited the Miller region and has transitioned to the FET enhancement region, IDRV-HS and IDRV-LS may indicate that the gate current needs to be boosted to I-Post-Ch (a current with a magnitude greater than I-Drive) to reduce losses in the enhancement region.

The control circuit 150 includes a gate driver 460 which has a first input 462 coupled to receive the PWM signal, a second input 464 coupled to receive IDRV-HS, and a third input 466 coupled to receive IDRV-LS. The gate driver 460 provides the high-side gate signal Gate_MH1 to the gate of MH1 and provides the low-side gate signal Gate_ML1 to ML1. As discussed before, in this example, Gate_ML1 is a PWM signal which causes the low-side FET ML1 to rapidly switch while Gate_MH1 maintains the high-side FET MH1 in an "on" state.

Figure 5:
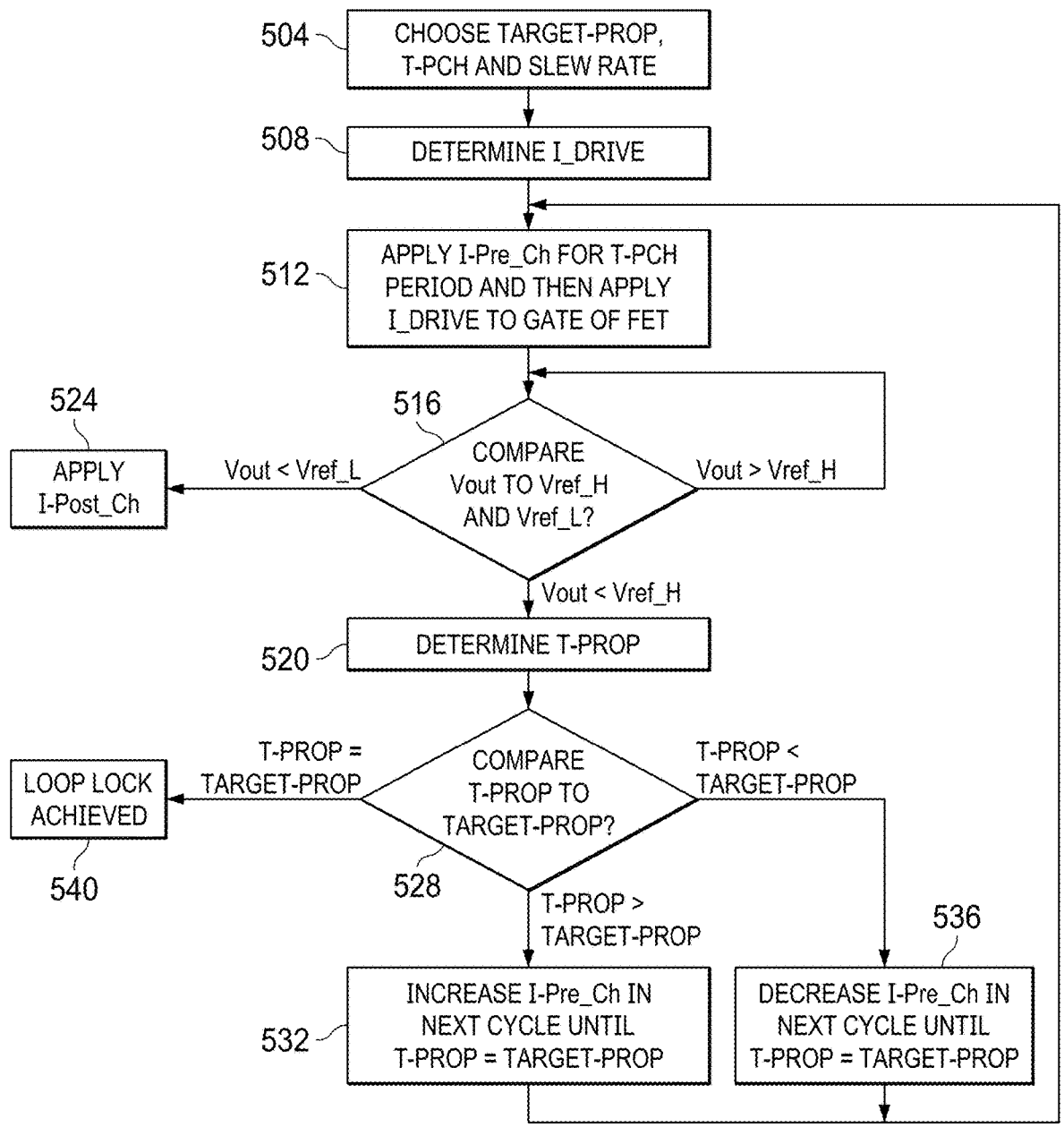
FIG. 5 is a flow diagram of a method of an example embodiment.

FIG. 5 is a flow diagram of a method of an example embodiment. The method regulates propagation delay of a field effect transistor (FET). While the following description is with reference to a single FET, the method of some example embodiments is also applicable to the other high-side and low-side FETs. In block 504, a target propagation delay TARGET-PROP; a pre-charge period T-PCH; and an output voltage slew rate are provided to the circuitry of FIG. 1. The target propagation delay TARGET-PROP can be chosen based on, for example, system requirements. The pre-charge period T-PCH, the time duration in which a pre-charge current I-Pre_Ch is applied to the gate of the FET, may be determined based on system requirements. The pre-charge period T-PCH is determined to be less than the target propagation delay TARGET-PROP. The slew rate may be chosen based on system requirements (e.g., EMC/EMI requirements). In block 508, based on the output voltage slew-rate, the required gate current I-Drive is determined. The gate current I-Drive is defined as the gate current required to maintain the desired slew-rate. As discussed before, I-Drive can be derived from the equation: $dV/dt = I\_Drive/C_{GD}$, where $C_{GD}$ is an equivalent capacitance between the gate and the drain of the FET and dV/dt is the slew rate.

In block 512, a gate signal is applied to the FET. The gate signal has magnitude (current) that is equal to the initial pre-charge current I-Pre_Ch and it is applied for the pre-charge period T-PCH. Thereafter, the current is reduced to a magnitude equal to I_Drive. In block 516, the output voltage Vout (e.g. Vout1 and/or Vout2) is compared to an upper reference voltage Vref_H and a lower reference voltage Vref_L.

If Vref_L<Vout<Vref_H (indicating FET operation in the Miller region), the method proceeds to block 520, where a propagation delay T-Prop is determined. In an example embodiment, T-Prop is equal to the period from the rising edge of the gate signal until Vout falls below Vref_H. If Vout<Vref_L, the gate current is increased, in block 524, to a post-charge level I-Post_Ch. As Vout slews down from Vref_H to Vref_L, the gate current I_Drive is applied to the FET, which causes Vout to slew at the desired rate. However, once Vout drops below Vref_L, the gate current is increased to I-Post_Ch as discussed above.

If Vout>Vref_H, which indicates the FET has not yet transitioned to the Miller region, the method returns to block 516 where the output voltage Vout is compared to the upper reference voltage Vref_H and the lower reference voltage Vref_L.

In block 528, T-Prop is compared to Target-Prop. If T-Prop>Target-Prop, the pre-charge current I-Pre_Ch in the next gate signal is increased in order to reduce T-Prop, in block 532, and the method returns to block 512. If T-Prop<TARGET-PROP, I-Pre_Ch is reduced in order to increase T-Prop, in block 536, and the method returns to block 512. The steps of increasing/decreasing the pre-charge current are repeated in the next gate signals until the propagation delay period is approximately equal to the target propagation delay. If T-Prop is approximately equal to TARGET-PROP, the method ends in block 540 at which stage a loop lock is achieved which allows the control circuit 150 to regulate T-Prop. Subsequent operation of the circuitry of FIG. 1, involves, as discussed above, adjusting the gate current (with T-Prop fixed at TARGET-PROP) to maintain proper operation of the circuitry.

In the foregoing discussion and in the claims, the terms "including" and "comprising" are used in an open-ended fashion, and thus should be interpreted to mean "including, but not limited to . . . ." An element or feature that is "configured to" perform a task or function may be configured (e.g., programmed or structurally designed) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof. Additionally, uses of the phrases "ground" or similar in the foregoing discussion are intended to include a chassis ground, an Earth ground, a floating ground, a virtual ground, a digital ground, a common ground, and/or any other form of ground connection applicable to, or suitable for, the teachings of the present disclosure. Unless otherwise stated, "approximately" preceding a value means+/−10 percent of the stated value. As used herein, the term "modulate" shall also mean "to vary" or "to change." As used herein, the terms "terminal", "node", "interconnection", "pin" and "lead" are used interchangeably. Unless specifically stated to the contrary, these terms are generally used to mean an interconnection between or a terminus of a device element, a circuit element, an integrated circuit, a device or other electronics or semiconductor component. For example, an integrated resistor would be referred to having two terminals (ends) even though these "terminals" are just the two connections to the integrated resistor.

While the use of particular transistors are described herein, other transistors (or equivalent devices) may be used instead. For example, a p-type metal-oxide-silicon FET ("MOSFET") may be used in place of an n-type MOSFET with little or no changes to the circuit. Furthermore, other types of transistors may be used (such as bipolar junction transistors (BJTs)).

The above discussion is meant to be illustrative of the principles and various embodiments of the present disclosure. Numerous variations and modifications will become apparent to those skilled in the art once the above disclosure is fully appreciated. It is intended that the following claims be interpreted to embrace all such variations and modifications.

What is claimed is:

1. An apparatus comprising:
   a first comparison circuit having a first input, a second input, and a third input;
   a propagation delay detection circuit having a first input and a second input coupled to the first comparison circuit;
   a current level control circuit having a first input and a second input coupled to the propagation delay detection circuit;
   a gate current selection circuit having a first input, a second input, a third input, and a fourth input; and
   a gate driver having a first and a second input coupled to the gate current selection circuit.

2. The apparatus of claim 1, including an adjust signal wherein the adjust signal is an increment (UP) signal if a propagation delay is greater than a target propagation delay and a decrement (DN) signal if the propagation delay is less than the target propagation delay.

3. The apparatus of claim 1, further comprising a timing control circuit having a first input and a second input.

4. The apparatus of claim 2, wherein responsive to the UP signal and a timing signal indicating a FET has not transitioned to a Miller region, the gate current selection circuit increases a gate current level value.

5. The apparatus of claim 2, wherein responsive to the DN signal and a timing signal indicating a FET has not transitioned to a Miller region, the gate current selection circuit decreases a gate current level value.

6. The apparatus of claim 4, wherein responsive to the increase of the gate current level value, the gate driver increases a pre-charge current level of a gate signal for a fixed duration.

7. The apparatus of claim 5, wherein responsive to the decrease of the gate current level value, the gate driver reduces a pre-charge current level of a gate signal for a fixed duration.

8. The apparatus of claim 1, wherein responsive to a timing signal indicating a FET has transitioned to the Miller region, the gate current selection circuit reduces a gate current level value corresponding to a predetermined output voltage slew rate.

9. The apparatus of claim 1, wherein the first comparison circuit comprises:
   a first comparator having a non-inverting input and an inverting input; and
   a second comparator having a non-inverting input and an inverting input.

10. A motor driver circuit, comprising:
    a field effect transistor (FET) having a first terminal coupled to an output voltage terminal, a second terminal coupled to a ground terminal, and a control terminal;
    a gate driver having a first input, a second input and an output coupled to the control terminal of the FET;
    a gate current selection circuit having a first input, a second input, a third input, a fourth input and an output coupled to the second input of the gate driver;
    a current level control circuit having a first input and a second input;
    a propagation delay detection circuit having a first input coupled to the first input of the gate driver and a second input; and
    a comparison circuit having a first input adapted to be coupled to the output voltage terminal, a second input adapted to be coupled to an upper reference voltage, and a third input adapted to be coupled to a lower reference voltage.

11. The motor driver circuit of claim 10, wherein an adjust signal is an increment (UP) signal when a propagation delay is greater than an target propagation delay and a decrement (DN) signal when the propagation delay is less than the target propagation delay.

12. The motor driver circuit of claim 10, further comprising a timing control circuit having a first input coupled to the first input of the gate driver and a second input.

13. The motor driver circuit of claim 11, wherein responsive to the UP signal and a timing signal indicating the FET has not transitioned to a Miller region, the gate current selection circuit increases a gate current level voltage.

14. The motor driver circuit of claim 11, wherein responsive to the DN signal and a timing signal indicating the FET has not transitioned to a Miller region, the gate current selection circuit decreases a gate current level voltage.

15. The motor driver circuit of claim 13, wherein responsive to the increase of the gate current level voltage, the gate driver increases a pre-charge current level of a gate signal for a fixed duration.

16. The motor driver circuit of claim 14, wherein responsive to the decrease of the gate current level voltage, the gate driver reduces a pre-charge current level of a gate signal for a fixed duration.

17. The motor driver circuit of claim 12, wherein responsive to a timing signal indicating the FET has transitioned to a Miller region, the gate current selection circuit reduces the gate current level voltage corresponding to a output voltage slew rate.

* * * * *